United States Patent [19]
Morita et al.

[11] Patent Number: 5,299,149
[45] Date of Patent: Mar. 29, 1994

[54] SYSTEM FOR DETECTING ALTERNATING VOLTAGE AND/OR CURRENT

[75] Inventors: Noboru Morita, Yokohama; Makoto Kusunoki, Fukaya, both of Japan

[73] Assignee: Kabushiki Kaisha Toshiba, Kawasaki, Japan

[21] Appl. No.: 696,571

[22] Filed: May 8, 1991

[30] Foreign Application Priority Data

May 8, 1990 [JP] Japan .................. 2-116791

[51] Int. Cl.$^5$ .............................. G06F 15/56
[52] U.S. Cl. .................. 364/576; 324/522; 364/483
[58] Field of Search ......... 364/481, 483, 487, 492, 364/576; 324/77 A, 77 R, 83 R, 522; 361/80

[56] References Cited

U.S. PATENT DOCUMENTS

| | | | |
|---|---|---|---|
| 4,625,283 | 11/1986 | Hurley | 364/483 X |
| 4,644,268 | 2/1987 | Malka et al. | 324/77 A X |
| 4,667,198 | 5/1987 | Suzuki | 364/483 X |
| 4,672,555 | 6/1987 | Hart et al. | 364/483 |
| 4,709,295 | 11/1987 | Yamaura et al. | 364/483 X |
| 4,774,621 | 9/1988 | Andow | 364/483 X |
| 4,794,369 | 12/1988 | Haferd | 364/483 X |
| 4,811,236 | 3/1989 | Brennen et al. | 364/483 |
| 4,947,109 | 8/1990 | Suzuki | 364/483 X |
| 5,027,285 | 6/1991 | McCartney et al. | 364/483 X |

FOREIGN PATENT DOCUMENTS

| | | |
|---|---|---|
| 0322518 | 9/1988 | European Pat. Off. . |
| 57-198872 | 2/1983 | Japan . |
| 1-072078 | 9/1987 | Japan . |

OTHER PUBLICATIONS

"Protective Relay Engineering", IEEEJ, 1981, pp. 112-113.

*Primary Examiner*—Kevin J. Teska
*Attorney, Agent, or Firm*—Foley & Lardner

[57] ABSTRACT

A system for detecting a voltage and/or current of a single phase and/or polyphase alternating current includes a sample-hold circuit that detects and holds instantaneous values of a plurality of sampling points over a fixed time period of the alternating current as sampled values. A first calculation circuit calculates the real part and the imaginary part of the Fourier coefficient with respect to a fundamental wave and/or a component of the positive-phase sequence of the alternating current detected from the plurality of sampled values thus held and outputs respective calculated values thereof. A second calculation circuit performs a predetermined calculation to the calculated values of the real and imaginary parts and thereby calculates and outputs the amplitude of the fundamental wave and/or component of positive-phase sequence of the alternating current.

5 Claims, 6 Drawing Sheets

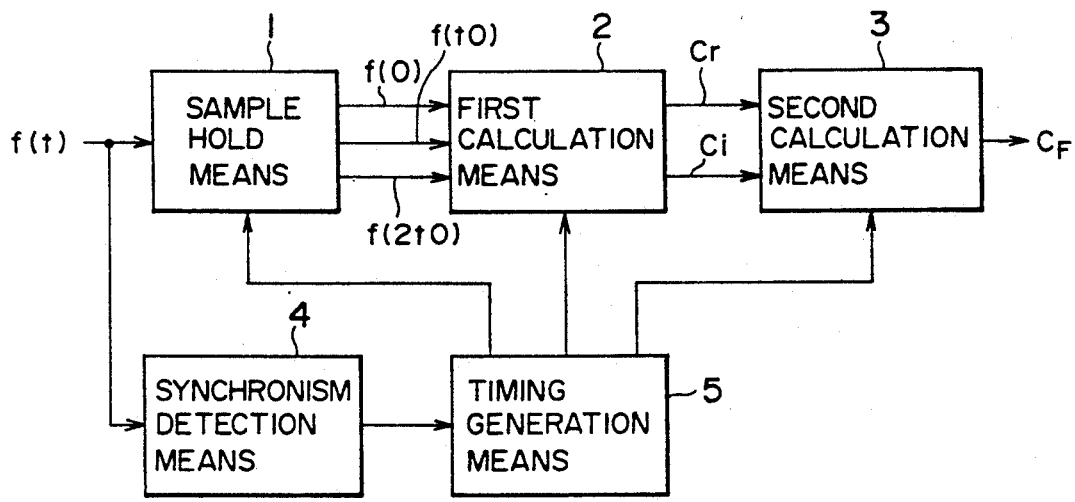
F I G. 1
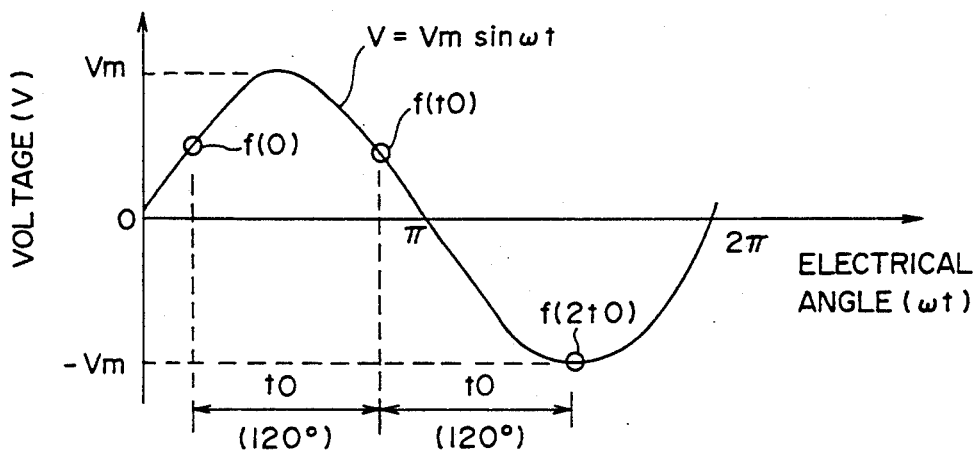
F I G. 2

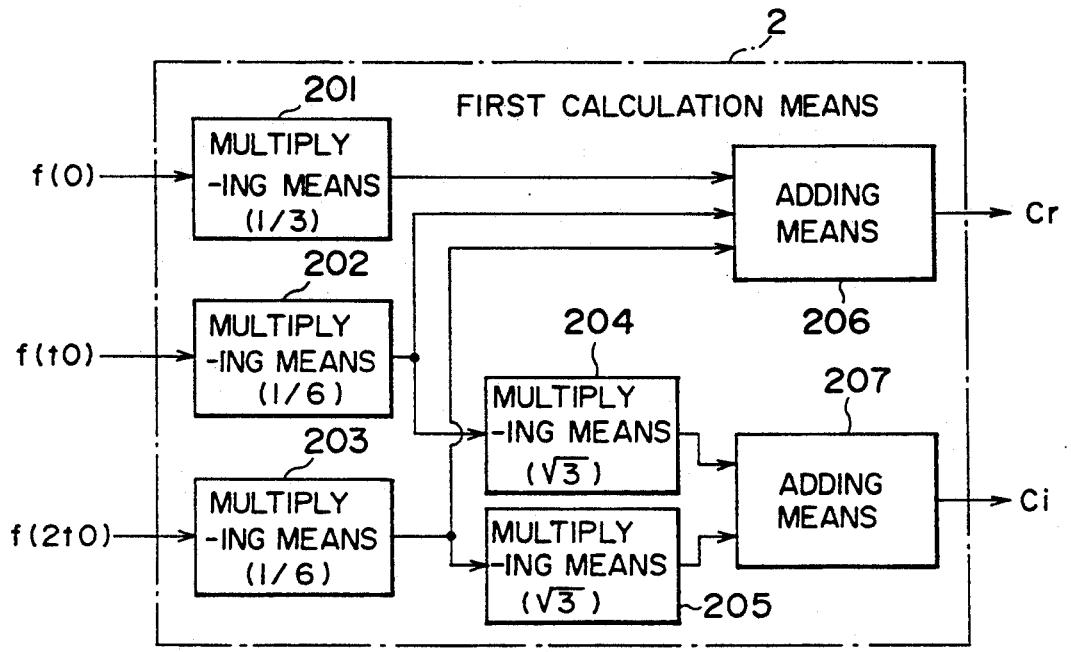
F I G. 3
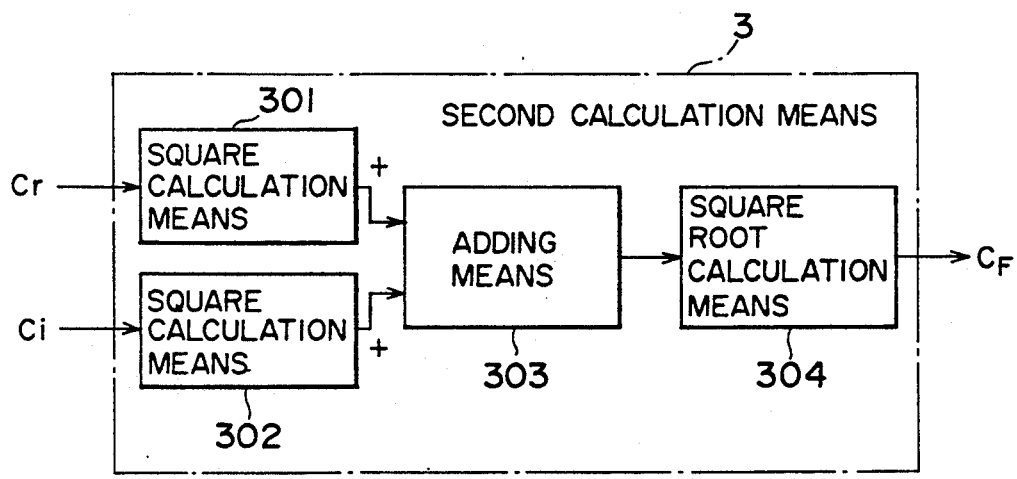
F I G. 4

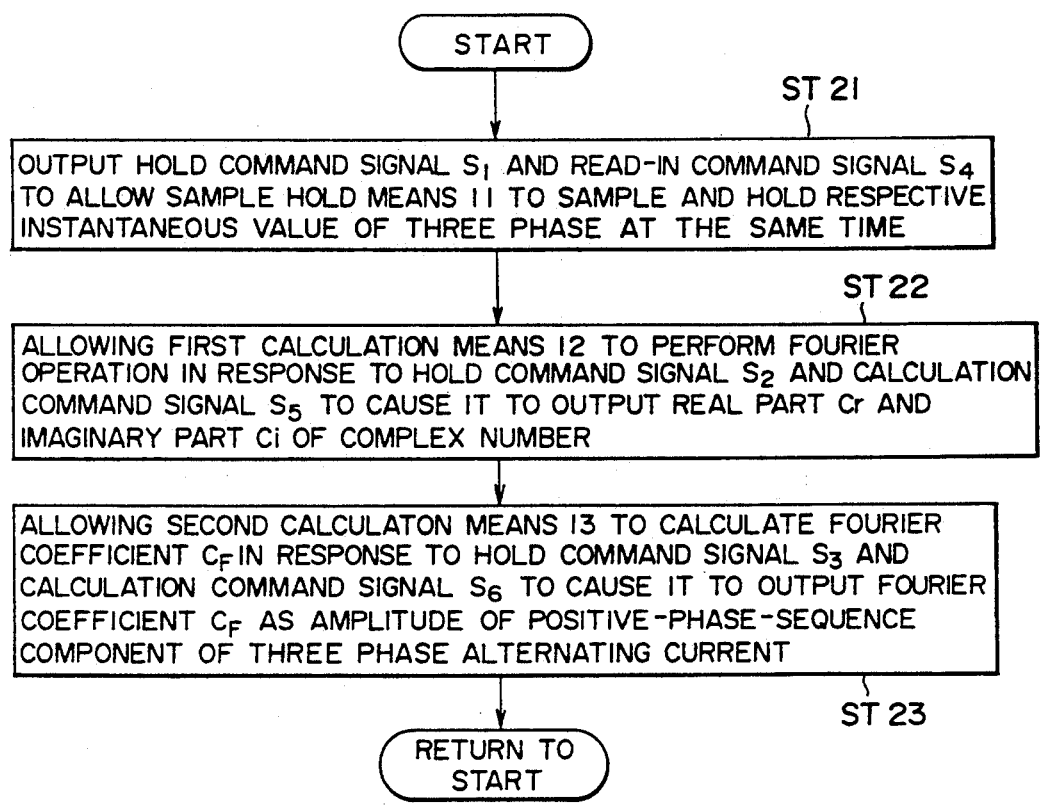
F I G. 10
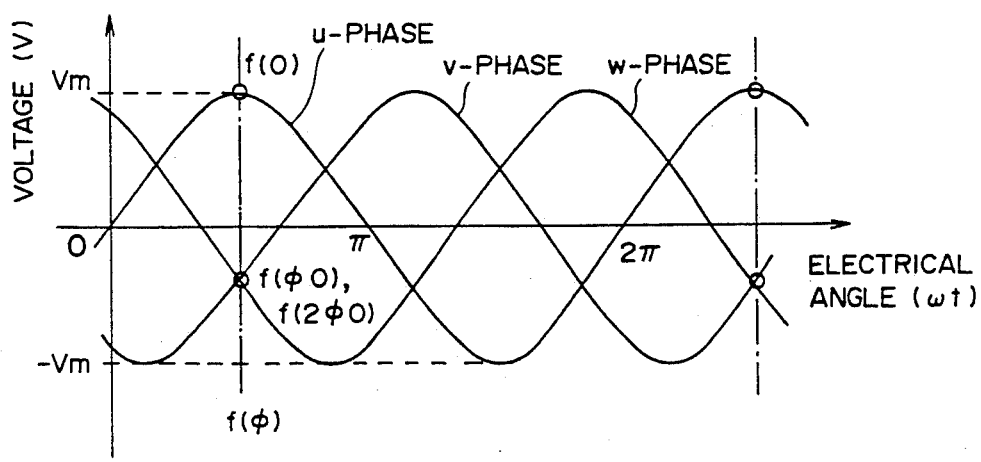
F I G. 11

SYSTEM FOR DETECTING ALTERNATING VOLTAGE AND/OR CURRENT

BACKGROUND OF THE INVENTION

This invention relates to a system for detecting an alternating voltage and/or current, and more particularly to a system for extracting some instantaneous values of an alternating voltage or current as sampled values to determine the amplitude of the alternating voltage or current from these sampled values.

As the system for detecting an alternating voltage and/or current of this kind, there are known the rectifier addition system and the productive addition system for determining the amplitude of a voltage and/or current in digital protective relays, etc. (see Protective Relay Engineering of the University Lecture of Institute of Electrical Engineers issued by IEEJ (Institute of Electrical Engineers of Japan), Jul. 20, 1981).

The rectifier addition system is the system for applying rectifier addition operation to a fundamental wave of an alternating voltage to convert it to a d.c. (direct current) voltage with the same precision as in the case of a sort of polyphase rectification. The ripple components correspond to errors by the sampling phase. Within this type of system there are variation such as the system in which the sampling period (time interval) is 90 degrees and two sampled values are used to perform the rectifier addition operation. Also known is the system in which the sampling period (time interval) is 30 degrees and six sampled values are used to perform the rectifier addition operation, and the like.

On the other hand, the productive addition system is the system in which the sampling period (time interval) is 90 degrees and two sampled values are used to perform productive addition operation of a fundamental wave. With this system, if there is no error in the sampled values, there occurs no error in the amplitude determined.

However, regardless of the type of rectifier addition system employed, since the operational equation itself is the approximate equation, there occurs an error dependent upon the phase of sampling.

With the productive addition system, no error occurs from a theoretical point of view, but since the operation is performed by using only two sampled values, there is the possibility that a large error may occur due to noise, etc.

SUMMARY OF THE INVENTION

The invention has been made with a view to solving the above-described problems, and its object is to provide a system for detecting an alternating voltage and/or current in which an operational equation including no error based on approximation and a suitably increased number of samples are used to thereby improve noise immunity to allow the system to have good precision of detection and high reliability.

To achieve the above-mentioned object, this invention provides a system for detecting an alternating voltage and/or current to extract some instantaneous values of an alternating voltage or current to determine the amplitude of the alternating voltage or current from these sampled values, the system comprising: sample-hold means for detecting and holding values of the alternating voltage or current every fixed sampling period (time interval) as sampled values, respectively, first calculation means for separating the real part and the imaginary part of the Fourier coefficient with respect to a fundamental wave of the alternating voltage and/or current from a plurality of sampled values thus held to calculate and output them, and second calculation means for calculating an amplitude of the fundamental wave from the calculated values of the the real part and the imaginary part to output the calculated amplitude therefrom.

The sample-hold means serves to detect and hold alternating voltage and/or current values every sampling interval $\theta_o$ within a fixed period T as sampled values $f(m\,\theta_o)$. The first calculation means calculates a Fourier series $f(\theta)$ and a Fourier coefficient $C_k$ at a fixed period T generally on the basis of the following equations (I) and (II)

$$\begin{cases} f(\theta) = \sum_{k=-\infty}^{\infty} C_k e^{ik\theta} & \text{(I)} \\ C_k = \frac{1}{T} \int_0^T f(\theta) e^{ik\theta} d\theta & \text{(II)} \end{cases}$$

Since an equation of complex number is provided by expansion of the above-mentioned equation (II), the real part Cr and the imaginary part Ci are separated by the first calculation means and are outputted therefrom.

When the first calculation means separates and outputs the real part Cr and the imaginary part Ci, the second calculation means inputs them to calculate a Fourier coefficient $C_F$ which is the amplitude of a fundamental wave from the following equation (III):

$$C_F = \sqrt{(Cr)^2 + (Ci)^2} \qquad \text{(III)}$$

The above-mentioned sampling period (time interval) $\theta_o$ may be considered as a time period $t_o$ between equivalent points of a time series in a single phase alternating current, or may be considered as a phase difference $\phi_o$ at the same time of respective phases in a polyphase alternating current. The former and the latter are hereinafter referred to as the first and second aspects, respectively. These aspects will now be described in detail.

In the first aspect, the sampling means detects instantaneous values of an alternating voltage as sampled values every time period $t_o$ of one N-th (N is an integer more than 2) of the period {thus, $(360/N)°$} of the alternating voltage. The first calculation means separates a Fourier coefficient $$C_F\left( = \frac{1}{N} \sum_{m=0}^{N-1} f(mt_o) e^{-i\frac{2\pi}{N}m} \right)$$

(see equation (4) described later) as the amplitude of a fundamental wave into the real part Cr and the imaginary part Ci from the above-mentioned sampled values $f(mt_o)$ (m=0, 1, 2, ... N-1 $t_o$: sampling time period) to calculate those parts. Further, the second calculation means calculates the coefficient expressed as $C_F = \sqrt{(Cr)^2 + (Ci)^2}$ (the above-mentioned equation (III)) from the calculated values of the real part and the imaginary part to output it as the amplitude of the fundamental wave.

The reason why the amplitude of a fundamental wave of an alternating voltage is determined in this way will be supplementarily described.

Generally, Fourier series f(t) and having a period T and Fourier coefficient $C_k$ are given by the following equations (1) and (2) corresponding to the above-mentioned equations (I) and (II):

Fourier series $$f(t) = \sum_{k=-\infty}^{\infty} C_k e^{i\frac{2\pi}{T}kt} \qquad (1)$$

Fourier coefficient $$C_k = \frac{1}{T} \int_0^T f(t) e^{-i\frac{2\pi}{T}kt} dt \qquad (2)$$

When the number of samples is assumed as N and the sampling period (time interval) is assumed as $t_o$ within one period, these equations (1) and (2) are transformed to those in a discrete system by substitution of $T=Nt_o$, $t=mt_o$ and $$\int_0^T dt = \sum_{m=0}^{N-1} t_o$$

into the above-mentioned equations. Thus, f(t) and $C_k$ are given by the following equations (3) and (4):

$$f(t) = \sum_{k=-\infty}^{\infty} C_k e^{i\frac{2\pi}{N}kt} \qquad (3)$$

$$C_k = \frac{1}{N} \sum_{m=0}^{N-1} f(mt_o) e^{-i\frac{2\pi}{N}mt} \qquad (4)$$

Here, when there is no d.c. component, but only a fundamental wave component, but only a fundamental wave component (k=1) exists, f(t) and $C_k$ are given by the following equations:

$$f(t) = C_1 e^{i\frac{2\pi}{N}t} \qquad (5)$$

$$C_1 = \frac{1}{N} \sum_{m=0}^{N-1} f(mt_o) e^{-i\frac{2\pi}{N}mt} \qquad (6)$$

Accordingly, by calculating the Fourier coefficient with respect to a plurality of sampling points of a time series of a fundamental wave of one phase in a single phase alternating current or a polyphase alternating current, it is possible to use it as the amplitude.

In the second aspect, instantaneous values of respective phases are detected as sampled values every phase difference of one N-th where N is an integer corresponding to the number of phases at the same time of a polyphase alternating current (since N>2, therefore N is equal to or larger than 2, the configuration of the first aspect is employed in the case of a two-phase alternating current). Accordingly, the equations (1) to (6) used in the above-mentioned first aspect become the following equations (1)' to (6)', respectively.

Fourier series f(φ) and fourier coefficient $C_k$ at a fixed period T are calculated by the following equations (1)' and (2)' on the basis of the above-mentioned equations (I) and (II).

$$f(\phi) = \sum_{k=-\infty}^{\infty} C_k e^{ik\phi} \qquad (1)'$$

$$C_k = \frac{1}{T} \int_0^T f(\phi) e^{ik\phi} d\phi \qquad (2)'$$

Further, when the number of samples and the sampling period (time period) are assumed as N and $\phi_o$ within one period, respectively, these equations (1)' and (2)' are transformed to those in a discrete system by substitution of $T=N\phi_o$, $\phi=m\phi_o$ and $$\int_0^T d\phi = \sum_{m=0}^{N-1} \phi_o$$

thereinto. Thus, f(φ) and $C_k$ are calculated from the following equations (3)' and (4)':

$$f(\phi) = \sum_{k=-\infty}^{\infty} C_k e^{ik\phi} \qquad (3)'$$

$$C_k = \frac{1}{N} \sum_{m=0}^{N-1} f(m\phi_o) e^{-im\phi} \qquad (4)'$$

Here, when d.c. component, i.e., component of of zero-phase sequence does not exist in f(φ), but only fundamental wave component, i.e., component of positive-phase sequence (K=1) exists therein, f(φ) and $C_k$ are calculated from the following equations (5)' and (6)':

$$f(\phi) = C_1 e^{i\phi} \qquad \ldots (5)'$$

$$C_1 = \frac{1}{N} \sum_{m=0}^{N-1} f(m\phi_o) e^{-im\phi} \qquad (6)'$$

Accordingly, it is possible to calculate Fourier coefficient with respect to the fundamental wave from the equation (6)' to provide it as the amplitude of the component of positive-phase sequence of a polyphase alternating current.

In accordance with this invention, since the amplitude of an alternating voltage is calculated from the fundamental wave Fourier coefficient, an error in the detection can be theoretically equal to zero.

Further, since the number of plural samples per each period can be suitably determined in a time series manner, noise immunity can be suitably enhanced.

In addition, by realizing the detection system with a hybrid system using both analog calculation means and a CPU, the computational processing is distributed to allow the burden on CPU to be light, thereby making it possible to provide a system for detecting with high precision and high reliability an alternating voltage and/or current.

BRIEF DESCRIPTION OF THE DRAWINGS

In the accompanying drawings:

FIG. 1 is a block diagram showing a basic configuration of a system for detecting an alternating voltage according to a first embodiment of this invention;

FIG. 2 is a waveform diagram showing an alternating voltage waveform that the system shown in FIG. 1 detects and sampling timings in this waveform;

FIG. 3 is a block diagram showing the detailed configuration of the first calculation means 2 shown in FIG. 1;

FIG. 4 is a block diagram showing the detailed configuration of the second calculation means 3 shown in FIG. 1;

FIG. 10 is a flowchart showing the processing operations of respective means shown in FIG. 8; and FIG. 11 is a waveform diagram showing sampling points between phases of a three-phase alternating current on the alternating current waveform.

DETAILED DESCRIPTION OF THE PREFERRED EMBODIMENTS

Figure 5:
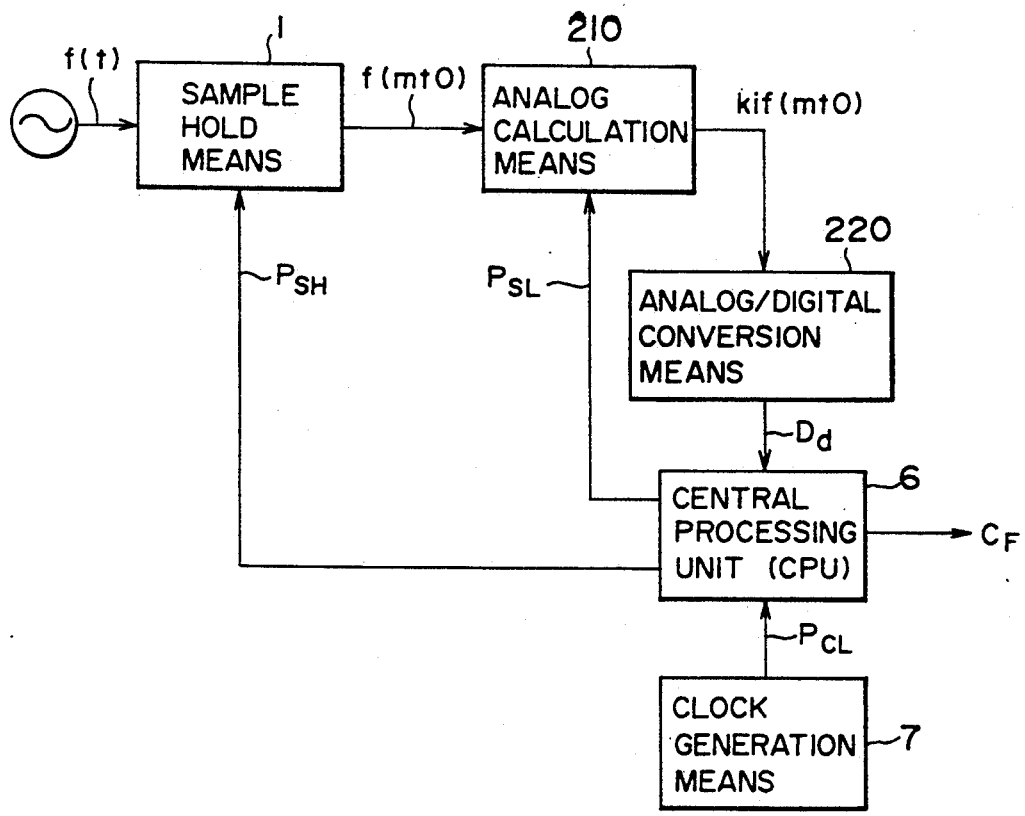
FIG. 5 is a block diagram showing a hardware configuration of a system for detecting an alternating voltage according to a second embodiment of this invention having a more actual or practical configuration.

Preferred embodiments of a system for detecting an alternating voltage according to this invention will now be described in detail with reference to the attached drawings.

FIGS. 1 to 4 show a detection system according to a first embodiment of this invention. In the first embodiment, explanation will now be given by taking an example of the system having three sampling points (N=3).

First, as shown in FIG. 1, the system according to the first embodiment is basically composed of sample-hold means 1 for sampling and holding an alternating voltage f(t) delivered from an object to be detected, first calculation means 2 for performing a calculation on the basis of three sampling points f(o), f($t_o$) and f($2t_o$) held by the sample-hold means 1 to calculate the real part Cr and the imaginary part Ci of the Fourier coefficient, second calculation means 3 for calculating Fourier coefficient $C_F$ on the basis of the real part Cr and the imaginary part Ci outputted from the first calculation means 2, synchronism (SYNC) detection means 4 for detecting SYNC of the alternating voltage f(t) from the object to be detected, and timing generation means 5 for generating fixed timings on the basis of the SYNC detected by the SYNC detection means 4 to deliver them to the sample-hold means 1, and first and second calculation means 2 and 3, respectively.

In this case, since the number of measurement sampling points is three, as shown in FIG. 2, sampling points f(o), f($t_o$) and f($2t_o$) are detected by the samplehold means 1 at an interval of the period $t_o$ (120 degrees) of one third of the period T of an alternating voltage "Vm sin$\omega$t" to be measured.

Since the Fourier coefficient $C_F$ of the fundamental wave is calculated from the above-mentioned three sampled values in the first embodiment, the first calculation means 2 is comprised, as shown in FIG. 3, of multiplying means 201 to 205, and adding means 206 and 207. These multiplying means 201 to 205 may use a typical multiplier, or operational amplifiers may be applied thereto to realize the same effect as a fixed multiplication by each gain.

Further, the second calculation means is comprised, as shown in FIG. 4, of square calculation means 301 and 302, adding means 303, and square root calculation means 304.

Since the number of sampling points is 3 in the above-mentioned equation (6) in the first calculation means 2 shown in FIG. 3, the Fourier coefficient can be transformed as expressed by the following equation (7):

$$C_F = \frac{1}{3} \sum_{m=0}^{2} f(mt_o) e^{-i\frac{2}{3}\pi m t} \tag{7}$$

Expansion of this equation (7) gives $$C_F = \frac{1}{3}\left( f(o) - \frac{1}{2} f(t_o) - \frac{1}{2} f(2t_o) \right) + \tag{8}$$

$$i\frac{1}{3}\left( -\frac{\sqrt{3}}{2} f(t_o) + \frac{\sqrt{3}}{2} f(2t_o) \right)$$

Accordingly, the real part Cr and the imaginary part Ci of the Fourier coefficient $C_F$ are calculated by the following equations (9) and (10) put in order:

$$C_r = \frac{1}{3} f(o) - \frac{1}{6} f(t_o) - \frac{1}{6} f(2t_o) \tag{9}$$

$$C_i = -\frac{\sqrt{3}}{6} f(t_o) + \frac{\sqrt{3}}{6} f(2t_o) \tag{10}$$

The amplitude CF of the fundamental wave is calculated on the basis of the above-mentioned equation (III) by the second calculation means 3. The value thus calculated can be taken as the amplitude Vm of an alternating voltage $$CF = \sqrt{(Cr)^2 + (Ci)^2} \tag{III}$$

While explanation has been given to the detection system constructed on the basis of the elementary or basic concept of this invention by taking the example where one phase of a typical alternating voltage or current is subjected to sample-hold operation at three points of a time series in the above-described detection system of the first embodiment, a second embodiment shown in FIGS. 5 to 8 is conceivable as a more realistic or practical example of the configuration of the time series sampling.

The basic hardware configuration of the system according to a more realistic or practical second embodiment for carrying out this invention is shown in FIG. 5. This second embodiment is directed to the example of the system for detecting a known alternating voltage and/or current of a fixed frequency of a commercial power supply, etc.

Figure 6:
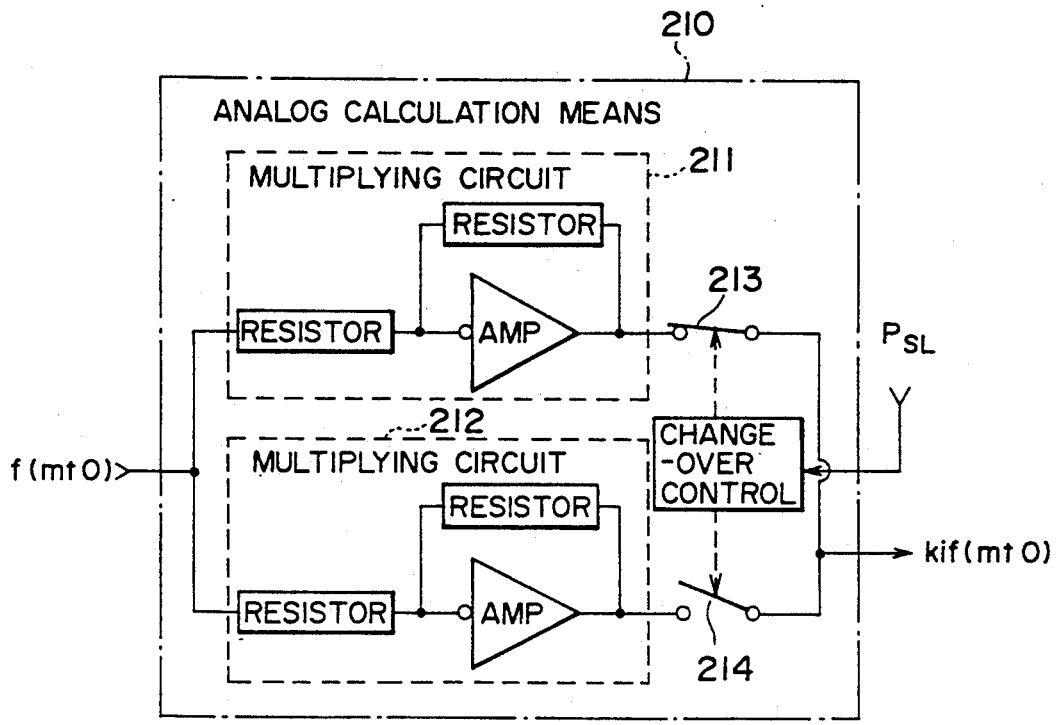
FIG. 6 is a circuit diagram showing the detailed configuration of the analog calculation means 210 shown in FIG. 5.

In FIG. 5, sample-hold means 1 samples and holds an alternating voltage f(t) at the timing of a hold pulse $P_{SH}$ from a CPU 6 to output a sampled value f($mt_o$). Analog calculation means 210 multiplies the output value by a constant Ki to calculate "Kif(mt$_o$)". In the second embodiment, the analog calculation means 210 is comprised, as shown in FIG. 6, of calculation circuits 211 and 212, and serves to multiply one sampled value by two constants (K$_1$=1/6, K$_2$=$\sqrt{3}$/6) by using switches 213 and 214 switched in response to a switching select pulse P$_{SL}$ outputted from the CPU 6. The select pulse P$_{SL}$ is delivered from the CPU 6 to a change-over controller 215 of the analog calculation means 210 shown in FIG. 6 to interchangeably make a change-over operation of the switches 213 and 214.

On the other hand, an A/D converter 220 converts the value in analog form to a value in digital from to deliver the digital data D$_d$ to the CPU 6. The CPU 6 outputs a hold pulse P$_{SH}$ and a select pulse P$_{SL}$ as a control pulse, and reads thereinto the digital data Dd converted to the value in digital form to apply data processing showing in FIG. 7 thereto to calculate and output the Fourier coefficient C$_F$ of a fundamental waveform. A clock generation means 7 serves to generate a clock pulse P$_{CL}$ of a fixed frequency to use it as a basic clock for the CPU 6.

The operation that the CPU 6 performs will now be described. The supplementary descriptions in the parentheses of the following description represent respective step numbers of the flowchart shown in FIG. 7.

The CPU 6 functions to output a hold pulse P$_{SH}$ having a time period t$_O$ on the basis of a basic clock pulse P$_{CL}$ of a fixed frequency. Every time this pulse P$_{SH}$ is outputted, the content Nc of the internal counter of the CPU 6 is updated. When the processing by CPU is initiated, the content Nc is set to zero (step ST1). Thus, the CPU 6 outputs a hold pulse P$_{SH}$, so the sampled value f(o) is held. Thus, the sample-hold means is placed in wait state (step ST2). Then, the switch 213 is closed in response to a select pulse P$_{SL}$ to multiply the sampled value f(o) by the coefficient 1/6 to store "(1/6)f(o)" into the internal memory as digital data (step ST3). Switching to the switch 214 is then carried out in response to the select pulse P$_{SL}$ to store "($\sqrt{3}$/6) f(o)" into the internal memory (step ST4). Then, determination as to whether or not the content Nc reaches 2, i.e., whether "Nc=2" holds true is made (step ST5). As a result, when the content Nc is not 2, the processing operation proceeds to step ST6 to take an idle period from the time point when the earlier hold pulse P$_{SH}$ is outputted to the time point when the subsequent pulse P$_{SH}$ is outputted (step ST6). After the idle period has passed, the internal counter is incremented (step ST7) to allow the processing operation to return to the step ST2 to repeatedly execute similar processing until "Nc=2" holds true. Thus, six data points obtained by respectively multiplying f(o), f(t$_o$) and f(2t$_o$) by coefficients 1/6 and $\sqrt{3}$/6 are stored into the internal memory. When "Nc =2" holds true the processing operation proceeds to the step ST8. At this step, calculation expressed as the above-mentioned equations (9) and (10) is performed using these data points. Thus, the real part Cr and the imaginary part Ci of the Fourier coefficient of the fundamental wave are calculated. In the CPU 6, there are provided tables F$_1$(x) and F$_2$(x) for calculating F$_1$(x)=x$^2$ and F$_2$(x) =$\sqrt{x}$ with respect to variable x. At step ST9, the table F$_1$(x) is used to calculate (Cr)$^2$ and (Ci)$^2$ to add these values at step ST10. At step ST11, the Fourier coefficient C$_1$ of the fundamental wave is calculated by using the table F$_2$(x). Thereafter, judgement as to whether or not the time period t$_0$ has passed is made in order to take an idle period (step ST12), and the value N$_c$ of the internal counter is reset to zero. Similar processing is repeatedly executed. Thus, the amplitude of the fundamental wave is detected every cycle of an alternating voltage.

In accordance with this embodiment, since the number of sampling points is set to three, the burden on the CPU required for detecting the amplitude is light. Thus, the CPU 6 can be effectively utilized for other processing.

Figure 7:
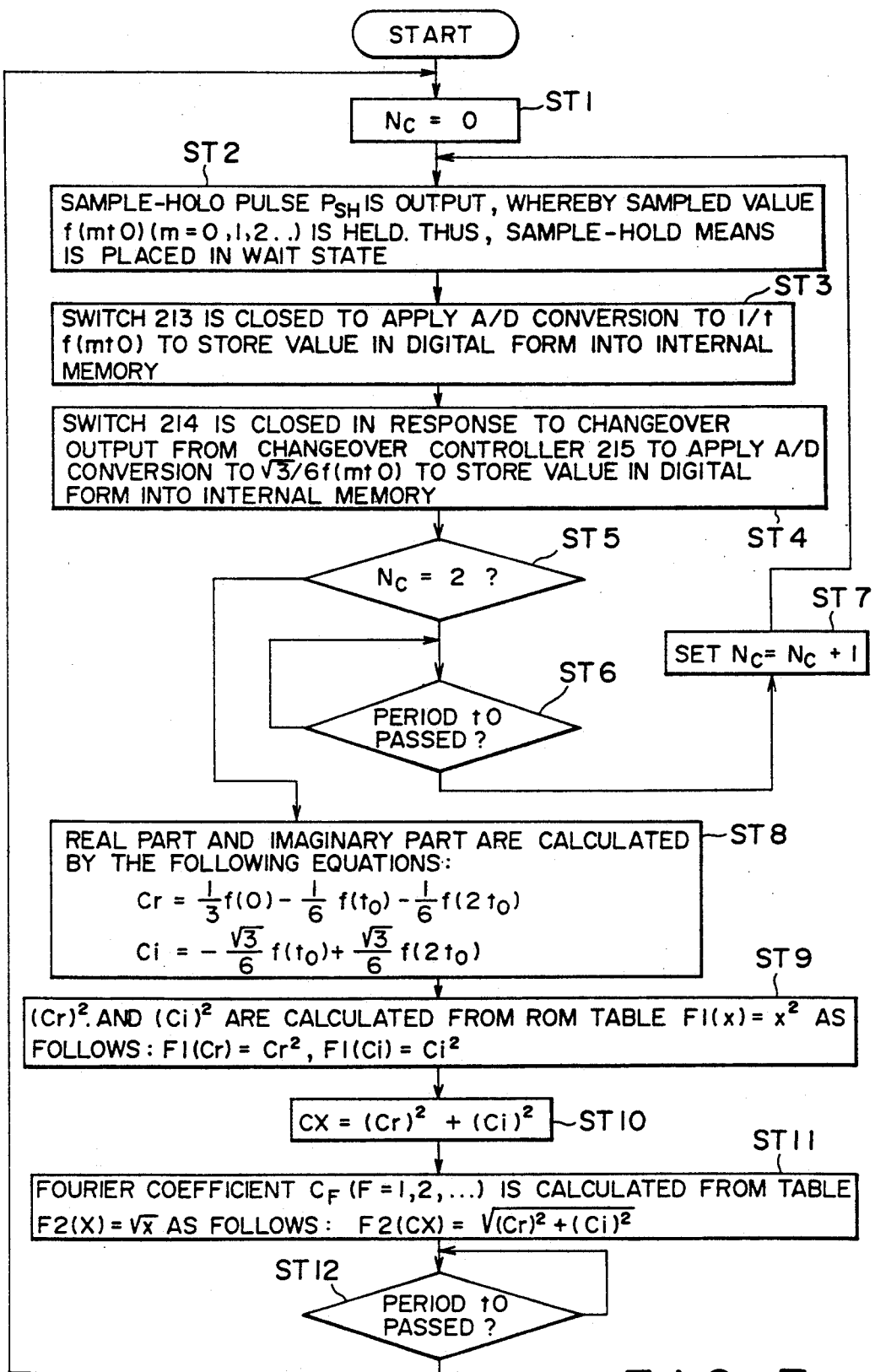
FIG. 7 is a flowchart showing the processing operation by the CPU 6 shown in FIG. 5.

It is to be noted that while it has been shown as an example for facilitating understanding in the description of operation of the second embodiment of FIG. 7 that the value Nc of the internal counter is reset to zero every time three sampling points are detected, if the number of sampling points is more than three, adjacent three data including latest data are used, thereby making it possible to detect the amplitude of a fundamental wave every ⅓ cycle.

In the system for detecting an alternating voltage and/or current according to the first and second embodiments, since a plurality of sampling points can be suitably determined in a time series manner every cycle, there is provided the advantage that the noise immunity property can be suitably enhanced.

Further, since the calculation processing system of the hybrid system comprised of analog calculation means and a CPU as digital calculation means carries out calculation through A/D converter means, there are also provided the advantages that the computational processing is distributed, so this system can function as a high precision and high reliability detection system, and the burden on CPU can be lessened significantly.

In the above-mentioned first and second embodiments, a plurality of sampling points are set in a time series manner. On the contrary, in a system for detecting an alternating voltage and/or current, instantaneous values in respective phases at the same time of a polyphase alternating current are detected. Such a detection system according to the third embodiment will now be described in detail with reference to FIGS. 8 to 10.

Also in the third embodiment, a three-phase alternating current is taken as an example wherein Fourier series f($\phi$) and Fourier coefficient C$_K$ are calculated by using three sampled values f(o), f($\phi_o$) and f(2$\phi_o$) provided by sampling and holding instantaneous values of a voltage and/or current at the same time every one point with respect to each phase.

Figure 8:
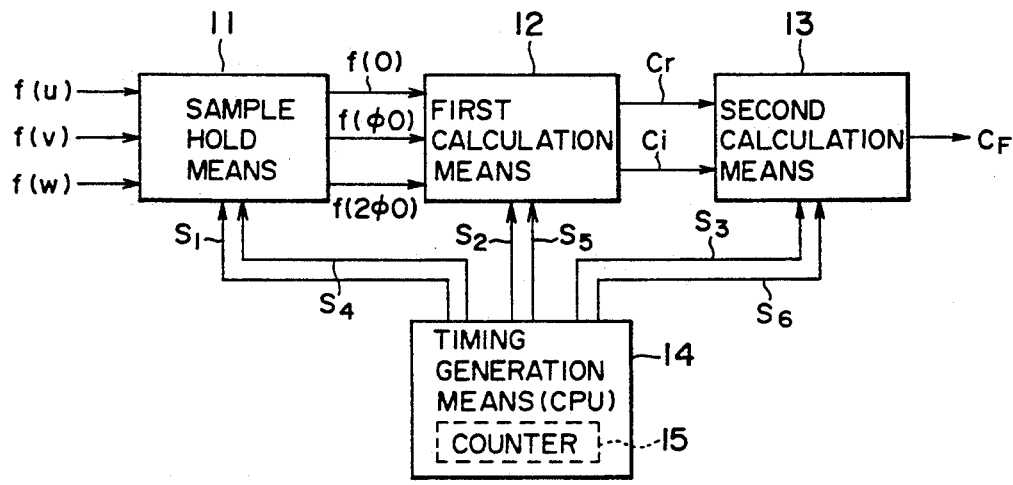
FIG. 8 is a block diagram showing a basic configuration of a system for detecting an alternating voltage and/or current according to a third embodiment based on the same time sampling system in which the sampling period is taken as a phase difference of a polyphase alternating current.

First, the detection system according to the third embodiment is composed, as shown in FIG. 8, of sample-hold means 11 for sampling and holding instantaneous values f(u), f(v) and f(w) of respective phases at the same time of a three-phase alternating voltage comprised of, e.g., u-phase, v-phase and w-phase as sampled values f(o), f($\phi_o$) and f(2$\phi_o$), respectively. First calculation means 12 performs a predetermined calculation on the basis of sampled values f(o), f($\phi_o$) and f(2$\phi_o$) held by the sample-hold means 11. First calculator means 12 calculates the Fourier coefficient comprised of complex numbers and outputs the real part Cr and the imaginary part Ci. Second calculation means 13, outputs the Fourier coefficient as the amplitude of the component of positive-phase sequence of the three-phase alternating current on the basis of the real part Cr and the imaginary part Ci delivered from the first calculation means 12. Timing generation means 14 comprised of, e.g., a CPU outputs hold command signals S$_1$ to S$_3$, a read-in command signal S$_4$, and calculation command signals S$_5$ and S$_6$ to the sample-hold means 11, the first calculation means 12, and the second calculation means 13, respectively. This timing generation means 14 includes a counter 15 for delaying rise timings of pulses of hold command signals $S_1$ to $S_3$ by predetermined times, respectively, and for generating the read-in command signal $S_4$ and the calculation command signals $S_5$ and $S_6$ in synchronism with the rise of signals $S_1$ to $S_3$.

Figure 9:
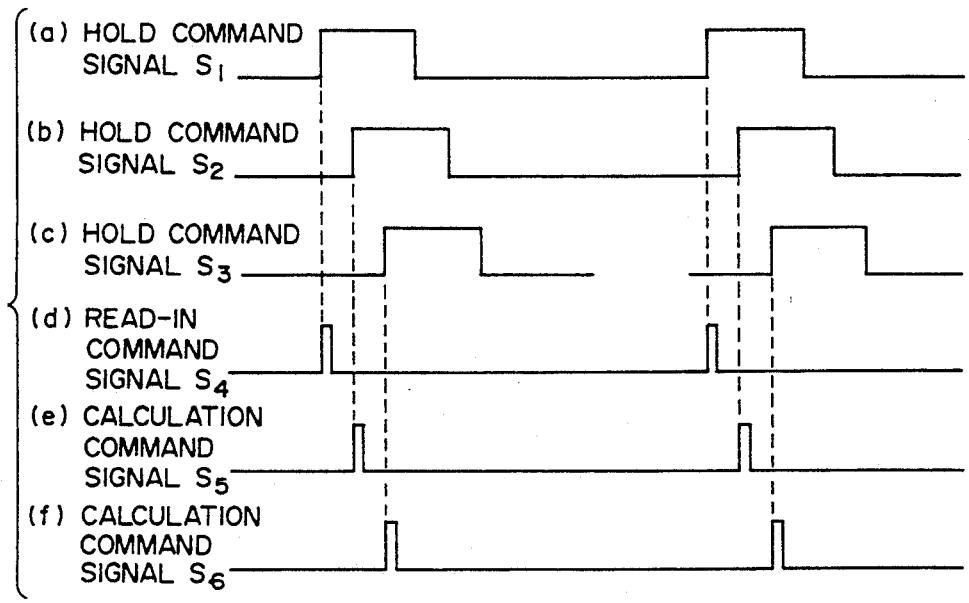
FIG. 9 is a timing chart showing an output waveform of a pulse signal outputted from the timing generation means in the detection system of the third embodiment.

The above-mentioned command signals $S_1$ to $S_6$ are pulse signals as indicated by the waveforms (a) to (f) in FIG. 9. The timings for sequentially delaying rise points of the hold command signals $S_1$ to $S_3$ can be changed depending upon the performance of the CPU or a desired response speed. Further, the read-in command signal $S_4$ is generated with the differential plus side of the rising pulse of the hold command signal $S_1$ being a reference. In addition, the calculation command signals $S_5$ and $S_6$ are generated with the differential pulse sides of the rising pulses of the hold command signals $S_2$ and $S_3$ being a reference, respectively.

In the detection system according to the third embodiment of which configuration has been described with reference to FIG. 8, the timing generation means 14 as CPU including the counter 15 provided therein performs a processing operation as shown in the flowchart of FIG. 10.

As shown in FIG. 10, at step ST21, the timing generation means 14 as a controller comprised of a CPU, outputs, to the sample-hold means 11, a hold command signal $S_1$ (FIG. 9(a)) and a read-in command signal $S_4$ (FIG. 9(d)) generated with the differential pluse side of the signal $S_1$ being as a reference to allow it to sample and hold instantaneous values f(u), f(v) and f(w) of three-phases of u-phase, v-phase and w-phase shown in FIG. 11. At step ST22, as shown in FIGS. 9(b) and 9(e), rising pulses provided by delaying the signals $S_1$ and $S_4$ by predetermined timings are outputted from the timing generation means 14 to the first calculation means 12. The first calculation means 12 calculates the Fourier series $f(\phi)$ and the Fourier coefficient $C_k$ by the above-mentioned equations (1)' and (2)' on the basis of inputted two command signals $S_2$ and $S_5$.

Namely, the Fourier series is expressed as follows:

$$f(\phi) = \sum_{k=-\infty}^{\infty} C_k e^{ik\phi} \qquad (1)'$$

Further, the Fourier coefficient is expressed as follows:

$$C_k = \frac{1}{T} \int_0^T f(\phi) e^{-ik\phi} d\phi \qquad (2)'$$

The calculation after the calculation performed by equation (2)' by the first calculation means 12 at the step ST22 is performed in accordance with the previously described equations (3)' to (6)'. Since the number of sampling points N in the above-mentioned equation (6)' is 3 in the third embodiment, the Fourier coefficient $C_F$ in this embodiment is transformed as indicated by the following equation (7)':

$$C_F = \frac{1}{3} \sum_{m=0}^{2} f(m\phi_o) e^{im\phi} \qquad (7)'$$

Expansion of this equation (7)' gives $$C_F = \frac{1}{3} \left\{ f(o) - \frac{1}{2} f(\phi_o) - \frac{1}{2} f(2\phi_o) \right\} + \qquad (8)'$$

$$i \frac{1}{3} \left\{ -\frac{\sqrt{3}}{2} f(\phi_o) + \frac{\sqrt{3}}{2} f(2\phi_o) \right\}$$

Accordingly, the real part Cr and the imaginary part Ci of the Fourier coefficient $C_F$ are calculated by the following equations (9)' and (10)' put in order:

$$C_r = \frac{1}{3} f(o) - \frac{1}{6} f(\phi_o) - \frac{1}{6} f(2\phi_o) \qquad (9)'$$

$$C_i = -\frac{\sqrt{3}}{6} f(\phi_o) + \frac{\sqrt{3}}{6} f(2\phi_o) \qquad (10)'$$

Since these equations (9)' and (10)' correspond to the previously described equations (9) and (10), respectively, exactly the same configuration as that of the first calculation means 2 shown in FIG. 3 can be applied as the configuration of the first calculation means 12.

Then, the processing operation proceeds to step ST23, at which the second calculation means 13 which has inputted the real part Cr and the imaginary part Ci outputted from the first calculation means 12 at the step ST22 calculates and outputs the Fourier coefficient $C_F$ as the amplitude of the component of positive-phase sequence of the three-phase alternating current by the above-mentioned equation (III) on the basis of the hold command signal $C_3$ and the calculation command signal $S_6$ outputted from the timing generation means 14:

$$C_F = \sqrt{(Cr)^2 + (Ci)^2} \qquad (III)$$

As stated above, in accordance with the detection system of the third embodiment constructed to sample and hold, by the number of phases, instantaneous values every phase at the time in a polyphase alternating current, calculation is carried out by making use of the fact that voltage (current) phases of, e.g., u-phase, v-phase and w-phase are different by an electrical angle of 120 degrees. Thus, it is possible to instantaneously calculate voltage or current vectors by sampling at the same time. Accordingly, there is provided the advantage unique to the third embodiment that even in the case where a frequency of a polyphase alternating current is controlled at a high speed, this detection system can be applied. In the case of the third embodiment, since sampling at the same time is carried out, there is no possibility from a theoretical point of view that any detection delay may occur. Thus, the detection speed will be dependent upon the processing speeds of respective calculation elements constituting the first and second calculation means.

It is to be noted while it has been described in the above-described first to third embodiments that the time-series sampling in a single-phase alternating current or in an alternating current of one phase of a polyphase and the sampling at the same time in a polyphase alternating current are individually applied, respectively, this invention is not limited to such an individual application. It is of course that this invention can be also applied to the combination of both the time series sampling and the same time sampling by using a predetermined Fourier transformation formula.

What is claimed is:

1. A system for detecting instantaneous values of electrical parameters of an electrical signal as a plurality of sampled values to determine an amplitude of said electrical parameters from said sampled values, said system comprising:

a sample-hold means for sampling and holding values of at least one of said electrical parameters, sampled over a fixed sampling period, as sampled values $f(mt_o)$ and outputting sample signals representing said sampled values;

a CPU outputting a hold command at predetermined time intervals to said sample-hold means and outputting a select command every time said hold command is outputted, said sample-hold means holding a value of one of said electrical parameters at each hold command as said sampled values $f(mt_o)$;

calculation means, receiving said sample signals from said sample-hold means, for determining a real part Cr and an imaginary part Ci of a Fourier coefficient of a fundamental wave component of a positive phase sequence of said one of said electrical parameters and generating electrical signals corresponding to said real and imaginary part, and for generating an amplitude of said one of said electrical parameters from said fundamental wave component, using said signals corresponding to said real and imaginary part and outputting an amplitude signal representing said amplitude, said calculation means including, analog calculation means receiving said sample signals representing said sampled values, for multiplying said sampled values $f(mt_o)$, and switch means connected to said analog calculation means, for outputting said sampled values multiplied by predetermined constants as analog data in response to said select command; and an analog-to-digital converter to convert said analog data to digital data, and wherein said CPU, forming part of said calculation means, stores said digital data into an internal memory to calculate the real part Cr and the imaginary part Ci of the Fourier coefficient with respect to a fundamental wave of said one of said electrical parameters.

2. A system for detecting electrical data according to claim 1, wherein said one of said electrical parameters is an alternating voltage.

3. A system for detecting electrical data according to claim 1, wherein said one of said electrical parameters is an alternating current.

4. A system as set forth in claim 1, wherein said predetermined constants are 1/6 and $$\frac{\sqrt{3}}{6}$$

in said calculation means, said CPU being operative to determine, by the following calculation equations, said real part Cr and said imaginary part Ci of the Fourier coefficient with respect to said fundamental wave of said one of said electrical parameters with adjacent three sampled values including the latest sampled value being taken as $f(o)$, $f(t_o)$ and $f(2t_o)$:

$$Cr = \frac{1}{3} f(o) - \frac{1}{6} f(t_o) - \frac{1}{6} f(2t_o)$$

$$Ci = -\frac{\sqrt{3}}{6} f(t_o) + \frac{\sqrt{3}}{6} f(2t_o)$$

5. A system as set forth in claim 4, further comprising a square table $F_1(x) = x^2$ and a square root table $F_2(x) = \sqrt{x}$ to enable said CPU to perform calculation of said $\sqrt{(Cr)^2 + (Ci)^2}$ by using said tables $F_1(x)$ and $F_2(x)$.

* * * * *